(12) United States Patent
Abdelkefi et al.

(10) Patent No.: US 9,786,832 B2
(45) Date of Patent: Oct. 10, 2017

(54) ENERGY HARVESTER

(71) Applicants: Samsung Electronics Co., Ltd., Suwon-si, Gyeonggi-do (KR); Virginia Tech Intellectual Properties, Inc., Blacksburg, VA (US)

(72) Inventors: Abdessattar Abdelkefi, Blacksburg, VA (US); Nathan Sharpes, Blacksburg, VA (US); Shashank Priya, Blacksburg, VA (US); Muhammad R. Hajj, Blacksburg, VA (US); Kyunghoon Cho, Yongin-si (KR); Hwiyeol Park, Ansan-si (KR); Jin S. Heo, Hwaseong-si (KR)

(73) Assignees: SAMSUNG ELECTRONICS CO., LTD., Gyeonggi-Do (KR); VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 396 days.

(21) Appl. No.: 14/589,182

(22) Filed: Jan. 5, 2015

(65) Prior Publication Data
US 2016/0197261 A1  Jul. 7, 2016

(51) Int. Cl.
*H01L 41/113* (2006.01)
*H02N 2/18* (2006.01)
(Continued)

(52) U.S. Cl.
CPC ........ *H01L 41/1136* (2013.01); *H01L 41/053* (2013.01); *H02K 35/02* (2013.01);
(Continued)

(58) Field of Classification Search
CPC ..... H01L 41/113; H01L 41/1136; H02N 2/18; H02N 2/186; H02N 2/188
(Continued)

(56) References Cited

U.S. PATENT DOCUMENTS 6,858,970 B2    2/2005  Malkin et al.
6,933,660 B2 *  8/2005  Maushard ........... H01L 41/0926
                                                    251/129.06
(Continued)

FOREIGN PATENT DOCUMENTS

DE    EP 2802069 B1 *  11/2016 ........... H01L 41/125
JP       2007221991 B2   8/2007
KR    1020130103907 A    9/2013

OTHER PUBLICATIONS

M. Kim et al., "Modeling and experimental verification of proof mass effects on vibration energy harvester performance," Smart Mater. Struct. 19, 045023 (2010).†
(Continued)

*Primary Examiner* — J. San Martin
(74) *Attorney, Agent, or Firm* — Cantor Colburn LLP

(57) ABSTRACT

An energy harvester for converting vibration energy into electrical energy and harvesting the electrical energy includes: a base; a clamping structure which is supported by the base and is spaced apart from the base; an elastic member which is disposed between the base and the clamping structure and allows the clamping structure to be elastically moved relative to the base; and a cantilever structure including a cantilever beam having one side fixed to the clamping structure and the other side which is elastically bendable, and a mass body disposed on the cantilever beam.

20 Claims, 12 Drawing Sheets

(51) Int. Cl.
    *H01L 41/053*     (2006.01)
    *H02N 1/08*     (2006.01)
    *H02K 35/02*     (2006.01)
    *H02N 2/00*     (2006.01)

(52) U.S. Cl.
    CPC ............... *H02N 1/08* (2013.01); *H02N 2/188* (2013.01); *H02N 2/22* (2013.01)

(58) Field of Classification Search
    USPC .......................................................... 310/339
    See application file for complete search history.

(56) References Cited

U.S. PATENT DOCUMENTS

| | | | |
|---|---|---|---|
| 7,649,305 | B2 | 1/2010 | Priya et al. |
| 7,667,375 | B2 | 2/2010 | Berkcan et al. |
| 7,821,183 | B2 | 10/2010 | Rastegar |
| 8,222,754 | B1 * | 7/2012 | Soliman ................... F03G 7/08 290/1 R |
| 2005/0253486 | A1 * | 11/2005 | Schmidt ............. H01L 41/1136 310/329 |
| 2008/0264537 | A1 * | 10/2008 | Behrends .............. B60C 23/041 152/152.1 |
| 2013/0062999 | A1 * | 3/2013 | Muker-Uz-Zaman . H02N 2/186 310/339 |
| 2013/0088123 | A1 * | 4/2013 | Haskett ............... H01L 41/1136 310/329 |
| 2015/0008795 | A1 * | 1/2015 | Kang .................. H01L 41/1136 310/331 |
| 2016/0294308 | A1 * | 10/2016 | Chen ........................ H02N 2/18 |
| 2017/0040912 | A1 * | 2/2017 | Furukawa ................ H02N 2/00 |
| 2017/0077839 | A1 * | 3/2017 | Karami .................. H02N 2/188 |
| 2017/0084815 | A1 * | 3/2017 | Choo .................... H01L 41/042 |

OTHER PUBLICATIONS

S. P. Beeby et al., "Energy harvesting vibration sources for microsystems applications," Meas. Sci. Technol. 17, R175-R195 (2006).†

M. Peigney, D. Siegert, "Piezoelectric energy harvesting from traffic-induced bridge vibrations," Smart Mater. Struct. 22, 095019 (2013).†

\* cited by examiner
† cited by third party

ENERGY HARVESTER

BACKGROUND

1. Field

The disclosure relates to an energy harvester, and more particularly, to an energy harvester that converts vibration energy into electrical energy in a frequency range with a wide bandwidth and harvests the electrical energy.

2. Description of the Related Art

Recently, a technology of harvesting energy that is in the environment has become an issue. For example, vibration energy that is generated in the environment may be converted into electrical energy using the piezoelectric effect, electrostatic effect, or electrodynamic effect, and such converted electrical energy may be harvested. An energy harvester that converts vibration energy into electrical energy and harvests the electrical energy may include a cantilever type energy harvester.

A general cantilever-type energy harvester generates electrical energy using a maximum displacement of a cantilever beam that occurs when the cantilever beam vibrates at a specific resonant frequency. The general cantilever-type energy harvester may harvest vibration energy only at a specific frequency having a narrow bandwidth. However, general vibration conditions in the environment do not include only a fixed specific frequency but include various frequencies in a predetermined range including the fixed specific frequency. Vibration energy in a predetermined frequency range may be harvested by a method using a plurality of cantilever beams having different resonant frequencies, but output power density of the harvested electrical energy may be substantially low.

SUMMARY

Embodiments of the invention relate to an energy harvester for converting vibration energy into electrical energy in a frequency range with a wide bandwidth and harvesting the electrical energy.

According to an embodiment of the invention, an energy harvester for converting vibration energy into electrical energy and harvesting the electrical energy includes: a base; a clamping structure which is supported by the base and is spaced apart from the base; an elastic member which is disposed between the base and the clamping structure and allows the clamping structure to be elastically moved relative to the base; and a cantilever structure including a cantilever beam having one side which is fixed to the clamping structure and the other side which is elastically bendable, and a mass body disposed on the cantilever beam.

In an embodiment, the cantilever structure may have a first resonant frequency, and the clamping structure may have a second resonant frequency. In such an embodiment, the first resonant frequency may be substantially the same as or similar to the second resonant frequency.

In an embodiment, the clamping structure may include a clamping bolt which passes through the base and fixes the one side of the cantilever beam, where a male screw is defined on an outer surface of the clamping bolt, and a clamping nut which is fitted onto an end portion of the clamping bolt and is spaced apart from the base, and the elastic member is disposed between the base and the clamping nut. In such an embodiment, a resonant frequency of the clamping structure may be determined based on an interval between the base and the clamping nut.

In an embodiment, a female screw corresponding to the male screw of the clamping bolt may be defined in the base, and a gap, which allows the clamping structure to be moved relative to the base, may be defined between the male screw of the clamping bolt and the female screw of the base. In such an embodiment, the clamping structure may further include a clamping plate which is coupled to the clamping bolt and fixes the one side of the cantilever.

In an embodiment, a cavity may be defined in the base, the clamping structure may include a cavity cover which covers the cavity and a clamping bolt which passes through the cavity cover and fixes the one side of the cantilever beam, where a male screw is defined on an outer surface of the clamping bolt, and the elastic member may be disposed between a bottom surface of the cavity and the cavity cover. In such an embodiment, a resonant frequency of the clamping structure may be determined based on an interval between the bottom surface of the cavity and the cavity cover.

In an embodiment, a gap, which allows the clamping structure to be moved relative to the base, may be defined between one end of the clamping bolt and the bottom surface of the cavity. In such an embodiment, the clamping structure may further include a clamping plate which is coupled to the clamping bolt and fixes the one side of the cantilever beam.

In an embodiment, the energy harvester may be a piezoelectric energy harvester. The energy harvester may further include a piezoelectric material disposed on the cantilever beam.

In an embodiment, the energy harvester may be an electrostatic energy harvester. In such an embodiment, the mass body may include an electret, and the energy harvester may further include a conductor spaced apart from the mass body. In such an embodiment, the mass body may include a conductor, and the energy harvester may further include an electret spaced apart from the mass body.

In an embodiment, the energy harvester may be an electrodynamic energy harvester. In such an embodiment, the mass body may include a magnet, and the energy harvester may further include a coil spaced apart from the mass body.

According to another embodiment of the invention, a method of manufacturing the energy harvester includes: adjusting a first resonant frequency of the cantilever structure and/or a second resonant frequency of the clamping structure to allow the first and second resonant frequencies to be substantially the same as or similar to each other. In such an embodiment, the first resonant frequency may be determined based on a weight of the mass body, and the second resonant frequency may be determined based on an interval between the clamping structure and the base.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
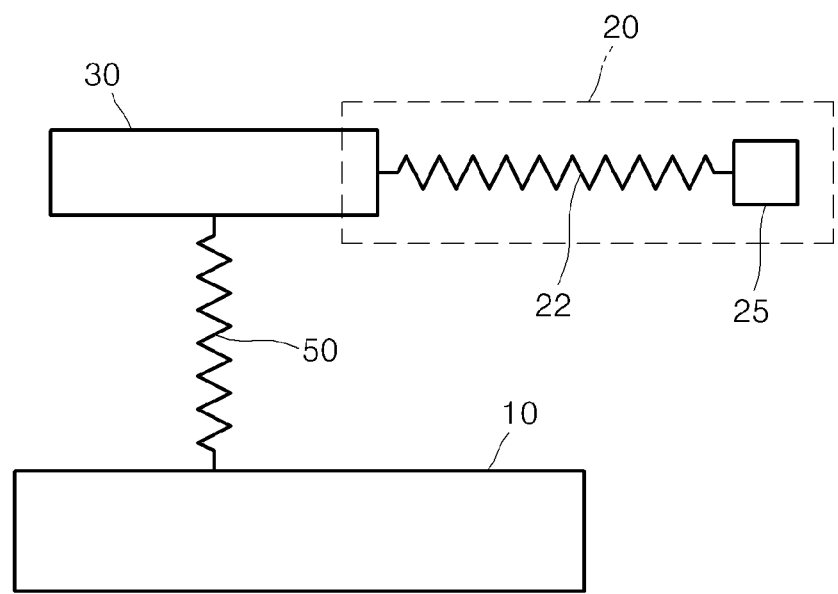
FIG. 1 is a schematic view illustrating a mass-spring model of an embodiment of an energy harvester according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a schematic view illustrating a mass-spring model of an embodiment of an energy harvester according the invention. In an embodiment, as shown in FIG. 1, the energy harvester, which is a device for converting vibration energy that is generated in the environment into electrical energy and harvesting the electrical energy, may be a piezoelectric energy harvester, an electrostatic energy harvester, or an electrodynamic energy harvester, for example.

Referring to FIG. 1, an embodiment of the energy harvester includes a base 10, a clamping structure 30 that is disposed on the base 10, and a cantilever structure 20 that is fixed to the clamping structure 30. An elastic member 50 is disposed between the base 10 and the clamping structure 30.

The cantilever structure 20 may include a cantilever beam 22 having one side (e.g., a first side) that is fixed to the clamping structure 30 and the other side (e.g., a second side) that is elastically bendable, and a mass body 25 that is disposed on the cantilever beam 22. The cantilever beam 22 may include a material that is elastically bendable by an external force. In one exemplary embodiment, for example, the cantilever beam 22 may include steel use stainless ("SUS"), copper (Cu), FR4 (e.g., Fr-4 glass epoxy), brass, iron (Fe), tungsten (W) or a combination thereof, but not being limited thereto. The mass body 25 may be disposed on, for example, an end portion of the cantilever structure 20. When vibration is applied to the energy harvester, the mass body 25 may be substantially vertically moved with respect to an extending direction of the cantilever beam 22, and thus the other side of the cantilever beam 22 is elastically bent.

The cantilever structure 20 functions to convert vibration energy into electrical energy due to deformation that occurs when the cantilever beam 22 is elastically bent. In an embodiment, when the energy harvester is a piezoelectric energy harvester using the piezoelectric effect, a piezoelectric material (not shown) may be disposed on the cantilever beam 22 and vibration energy may be converted into electrical energy based on deformation of the piezoelectric material that occurs when the cantilever beam 22 is bent. In an embodiment, where the energy harvester is an electrostatic energy harvester using the electrostatic effect, a conductor (not shown) may be provided to be spaced apart from the mass body 25 that includes an electret, and vibration energy may be converted into electrical energy based on a change in an interval between the conductor and the mass body 25 that occurs when the mass body 25 is moved. The term "electret" refers to a material having quasi-permanent polarization. In an embodiment, where the energy harvester is an electrodynamic energy harvester using the electrodynamic effect, a coil (not shown) may be provided to be spaced apart from the mass body 25 that includes a magnet, and vibration energy may be converted into electrical energy based on a change in a magnetic field that occurs in the coil when the mass body 25 is moved.

The clamping structure 30 that fixes the one side of the cantilever structure 20 is spaced apart from the base 10, and the elastic member 50 is disposed between the clamping structure 30 and the base 10. When vibration is applied to the energy harvester, the elastic member 50 functions to elastically move the clamping structure 30 substantially vertically with respect to the base 10, e.g., an upper surface of the base 10.

An embodiment of the energy harvester as described above may harvest energy in a frequency range with a wide bandwidth using a vibration system with two degrees of freedom. In an embodiment, the energy harvester may convert vibration energy into electrical energy and may harvest the electrical energy in a frequency range with a wide bandwidth using vibration of a first degree of freedom due to the cantilever structure 20 and vibration of a second degree of freedom due to the clamping structure 30. When external vibration is applied to the energy harvester, the cantilever structure 20 vibrates at a first resonant frequency and the clamping structure 30 vibrates at a second resonant frequency. The term "resonant frequency" refers to a frequency at which a vibration of a body or system is a relative maximum. As described below, when the first resonant frequency and/or the second resonant frequency are adjusted to be substantially the same as or similar to each other, the energy harvester may convert vibration energy into electrical energy and may harvest the electrical energy in a frequency range with a wide bandwidth. In such an embodiment, where the first resonant frequency and the second resonant frequency are substantially the same as or similar to each other, a difference between the first resonant frequency and the second resonant frequency may be equal to or less than 5 hertz (Hz). In one embodiment, for example, the difference between the first resonant frequency and the second resonant frequency may be equal to or less than 2 Hz.

Figure 2:
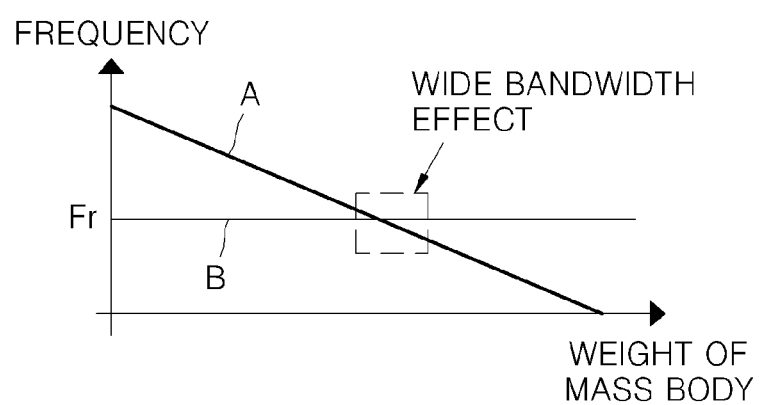
FIG. 2 is a graph illustrating first resonant frequency A of a cantilever structure and second resonant frequency B of a clamping structure versus weight of a mass body in the energy harvester of FIG. 1.

FIG. 2 is a graph illustrating first resonant frequency A (Hz) of the cantilever structure 20 and second resonant frequency B (Hz) of the clamping structure 30 versus weight (gram: g) of the mass body 25 in the energy harvester of FIG. 1.

Referring to FIG. 2, as the weight of the mass body 25 increases, the first resonant frequency A of the cantilever structure 20 decreases. The second resonant frequency B of the cantilever structure 30 may be determined based on the weight of the clamping structure 30, an elastic modulus of the elastic member 50, and an interval between the clamping structure 30 and the base 10, and is substantially constant with respect to the weight of the mass body 25. In an embodiment, as shown in FIG. 2, in a state where the second resonant frequency B of the clamping structure 30 is determined to be a predetermined frequency Fr, when the first resonant frequency A of the cantilever structure 20 is adjusted to be substantially the same as or similar to (e.g., as close as possible to) the second resonant frequency B of the clamping structure 30, the energy harvester of FIG. 1 may convert vibration energy into electrical energy and may harvest the electrical energy in a frequency range with a wide bandwidth, as shown in FIG. 3.

Figure 3:
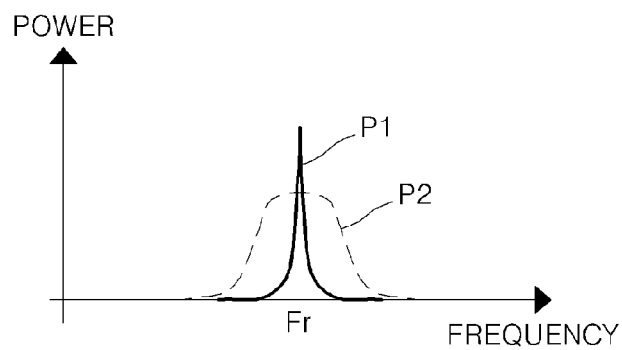
FIG. 3 is a graph illustrating the amount of power versus frequency of a conventional cantilever-type energy harvester and the amount of power versus frequency of the energy harvester of FIG. 1.

FIG. 3 is a graph illustrating amount of power P1 (watt: W) versus frequency (Hz) of a conventional cantilever-type energy harvester and amount of power P2 (W) versus frequency (Hz) of the energy harvester of FIG. 1.

Referring to FIG. 3, a conventional cantilever-type energy harvester that includes only a cantilever structure may harvest vibration energy only at a resonant frequency Fr with a very narrow bandwidth. In an exemplary embodiment shown in FIG. 1, the energy harvester may harvest vibration energy in a frequency range with a wide bandwidth including the resonant frequency Fr by adjusting the first resonant frequency A of the cantilever structure 20 and the second resonant frequency B of the clamping structure 30 to be substantially the same as each other as shown in FIG. 2. The energy harvester of FIG. 1 may be used as, for example, a power source of a mobile information technology ("IT") device or a power source of a wireless sensor network ("WSN") system, or may be used as a vibration sensor having a predetermined frequency range.

Embodiments of the energy harvester of FIG. 1, where the energy harvester is a piezoelectric energy harvester, an electrostatic energy harvester, or an electrodynamic energy harvester, will hereinafter be described in greater detail.

Figure 4:
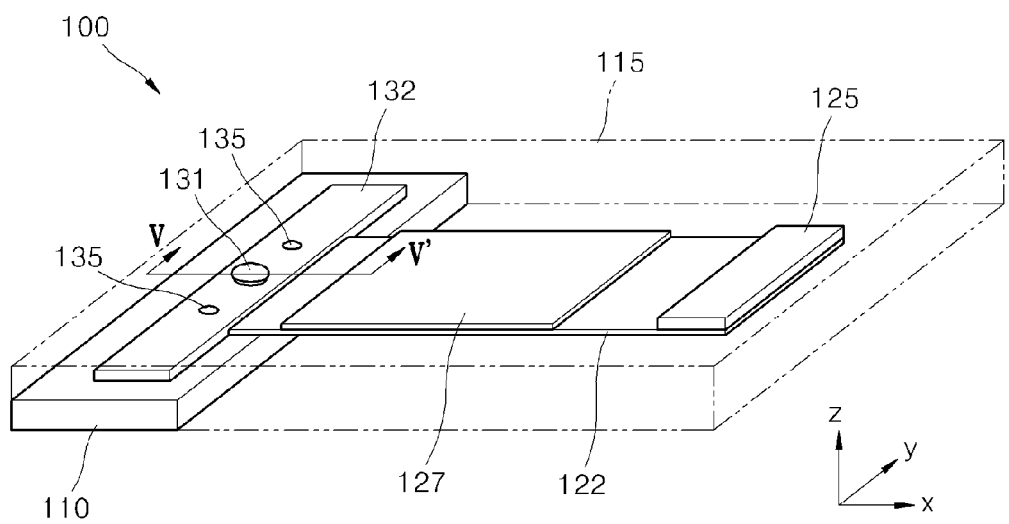
FIG. 4 is a perspective view of an embodiment of a piezoelectric energy harvester according to the invention.
Figure 5:
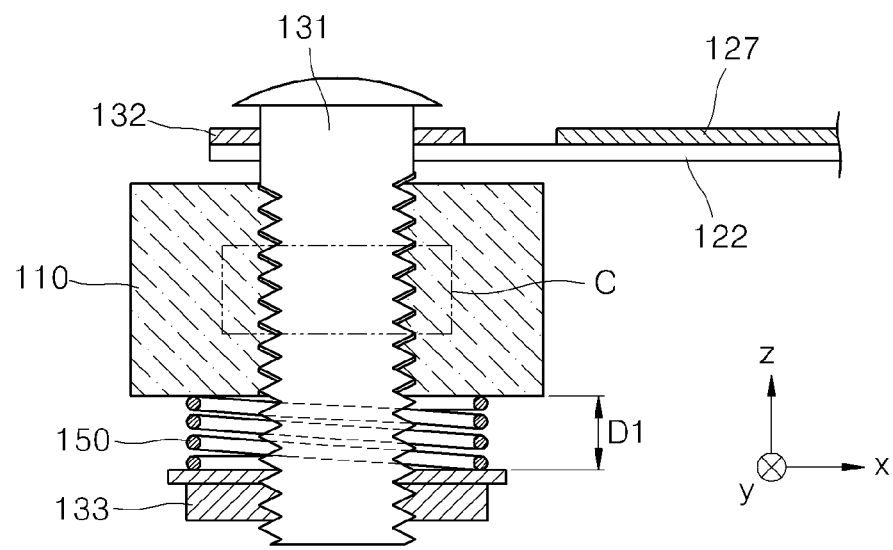
FIG. 5 is a cross-sectional view taken along line V-V' of FIG. 4.
Figure 6:
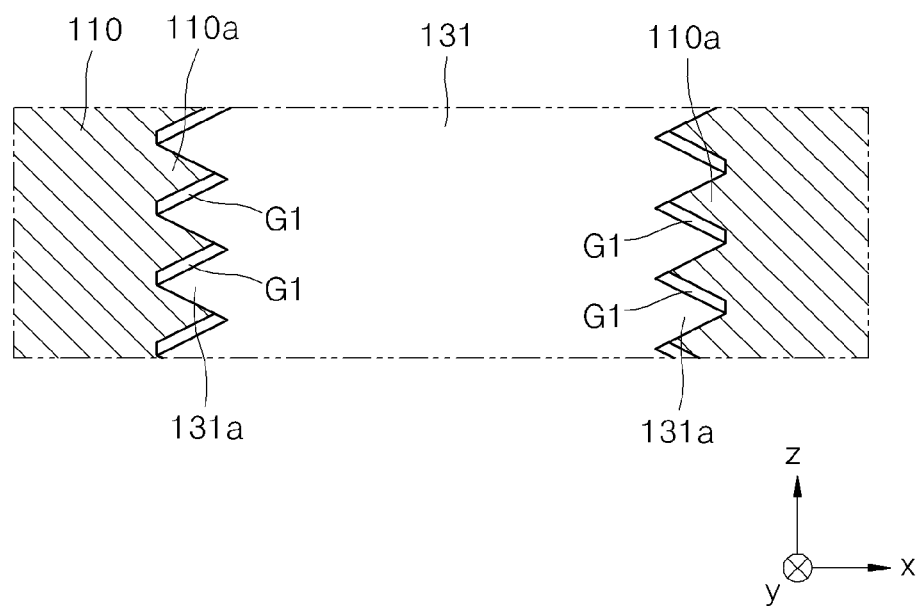
FIG. 6 is an enlarged cross-sectional view illustrating region C of FIG. 5.

FIG. 4 is a perspective view of an embodiment of a piezoelectric energy harvester 100 according to the invention. FIG. 5 is a cross-sectional view taken along line V-V' of FIG. 4. FIG. 6 is an enlarged cross-sectional view illustrating region C of FIG. 5.

Referring to FIGS. 4 through 6, an embodiment of the piezoelectric energy harvester 100 includes a base 110, a clamping structure that is supported by the base 110, a cantilever structure having one side that is fixed by the clamping structure, and a piezoelectric material 127 that is disposed on the cantilever structure. The cantilever structure includes a cantilever beam 122 having one side that is fixed by the clamping structure and the other side that is elastically bendable, and a mass body 125 that is disposed on the cantilever beam 122. The cantilever beam 122 may include, for example, but is not limited to, SUS, Cu, FR4, brass, Fe, W, or a combination thereof. The mass body 125 may be disposed on an end portion of the cantilever beam 122.

The piezoelectric material 127 may be disposed on the cantilever beam 122. In one embodiment, for example, the piezoelectric material 127 that is a material for generating electrical energy by deformation may include lead zirconium titanate ("PZT"), ZnO, SnO, polyvinylidene fluoride ("PVDF"), or poly(vinylidene fluoride-trifluoroethylene) ("P(VDF-TrFE)"), but not being limited thereto. In alternative embodiments, the piezoelectric material 127 may include various other materials. In an embodiment, as shown in FIGS. 4 and 5, the piezoelectric material 127 is disposed on a top surface of the cantilever beam 122, but not being limited thereto. In an alternative embodiment, the piezoelectric material 127 may be disposed on a bottom surface of the cantilever beam 122 or on both the top surface and the bottom surface of the cantilever beam 122. When the mass body 125 is substantially vertically moved due to external vibration, the other side of the cantilever beam 122 is elastically bent, and thus the piezoelectric material 127 that is disposed on the cantilever beam 122 is deformed, thereby generating electrical energy. Although not shown in FIGS. 4 through 6, electrodes for outputting the electrical energy that is generated by the piezoelectric material 127 may be further disposed on the cantilever beam 122.

A first resonant frequency of the cantilever structure may be determined based on a material and a size of the cantilever beam 122 and a weight of the mass body 125. In an embodiment, where the material and the size of the cantilever beam 122 are fixed or predetermined, the first resonant frequency of the cantilever structure may be adjusted by changing the weight of the mass body 125.

The clamping structure includes a clamping bolt 131 that passes through the base 110 and fixes the one side of the cantilever beam 122, and a clamping nut 133 that is fitted onto an end portion of the clamping bolt 131. The clamping nut 133 is spaced apart from the base 110. In an embodiment, a clamping plate 132 for more effectively fixing the cantilever beam 122 may be disposed on the one side of the cantilever beam 122. In such an embodiment, the one side of the cantilever beam 122 may be fixed by the clamping bolt 131 that passes through the clamping plate 132, the one side of the cantilever beam 122 and the base 110. In an embodiment, beam fixing members 135 for effectively preventing the cantilever beam 122 from being rotated may be further disposed on at least one side of the clamping bolt 131. The beam fixing members 135 may pass through, for example, but are not limited to, the clamping plate 132 and the one side of the cantilever beam 122.

In an embodiment, as shown in FIG. 5, the clamping bolt 131 and the base 110 may be coupled to each other by screw coupling. In an embodiment, a male screw 131a is defined, e.g., formed, on an outer surface of the clamping bolt 131, and a female screw 110a corresponding the male screw 131a is defined, e.g., formed, in the base 110. As shown in FIG. 6, a gap G1 is formed between the male screw 131a of the clamping bolt 131 and the female screw 110a of the base 110, and the clamping structure 110 may be vertically moved due to the gap G1.

The clamping nut 133 is spaced apart from a bottom surface of the base 110 by a predetermined interval, and an elastic member 150 is disposed between the bottom surface of the base 110 and the clamping nut 133. A female screw corresponding to the male screw 131a of the clamping bolt 131 is formed in the clamping nut 133, and an interval D1 between the base 110 and the clamping nut 133 may be adjusted using the clamping nut 133. The elastic member 150 allows the clamping structure to elastically move relative to the base 110 vertically. In one embodiment, for example, the elastic member 150 may be a compression coil spring that surrounds the clamping bolt 131. In such an embodiment, the elastic member 150 applies an elastic force to increase the interval D1 between the clamping nut 133 and the base 110. In an alternative embodiment, the elastic member 150 may include any of various elastic materials other than the compression coil spring.

In such an embodiment, when the gap G1 is provided between the male screw 131a of the clamping bolt 131 and the female screw 110a of the base 110, and the elastic member 150 is disposed between the base 110 and the clamping nut 133, the clamping structure may be elastically moved substantially vertically with respect to the base 110 due to external vibration. A second resonant frequency of the clamping structure may be adjusted using a weight of the clamping structure, an elastic modulus of the elastic member 150, and the interval D1 between the base 110 and the clamping nut 133. Accordingly, in an embodiment, where the weight of the clamping structure and the elastic modulus of the elastic member 150 are fixed or predetermined, the second resonant frequency of the clamping structure may be adjusted by changing the interval D1 between the base 110 and the clamping nut 133. In one embodiment, for example, the second resonant frequency of the clamping structure may be increased by reducing the interval D1 between the base 110 and the clamping nut 133.

The piezoelectric energy harvester 100, as described above, may convert vibration energy into electrical energy and may harvest the electrical energy by adjusting the first resonant frequency of the cantilever structure and/or the second resonant frequency of the clamping structure to make the first and second resonant frequencies substantially the same as or similar to each other. The piezoelectric energy harvester 100 may further include a housing 115, which is a case that covers the cantilever structure and the clamping structure and may be fixed to the base 110.

Figure 7:
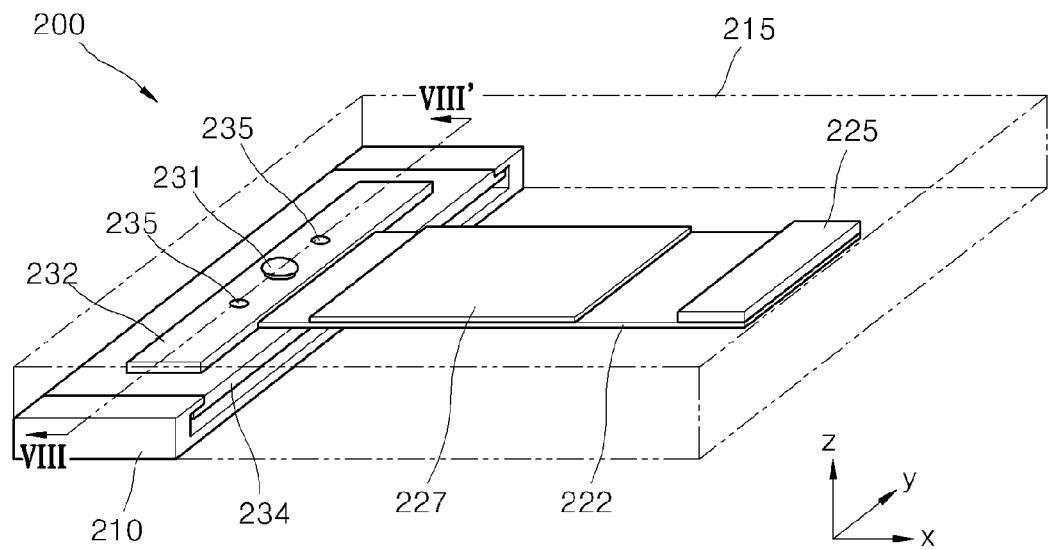
FIG. 7 is a perspective view of another embodiment of a piezoelectric energy harvester according to the invention.
Figure 8:
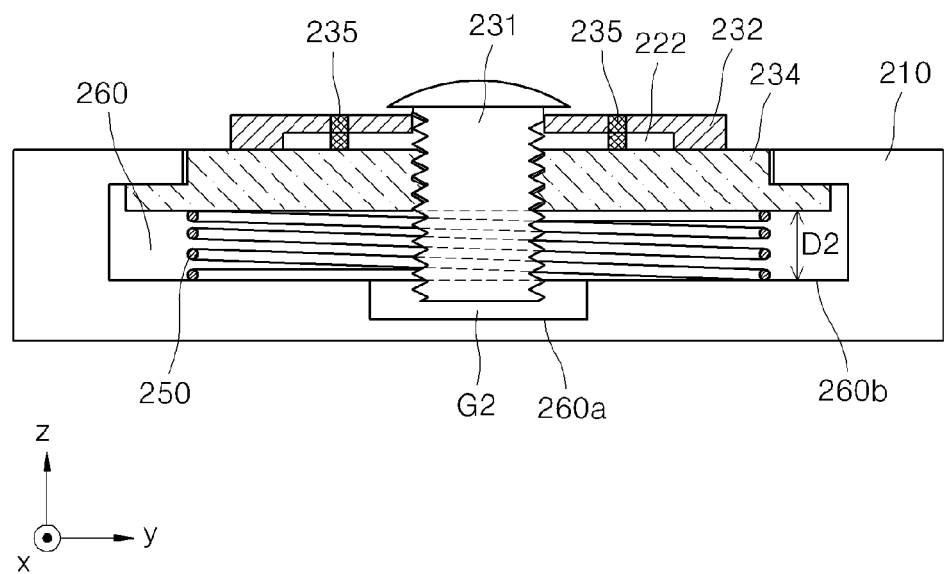
FIG. 8 is a cross-sectional view taken along line VIII-VIII' of FIG. 7.

FIG. 7 is a perspective view of another embodiment of a piezoelectric energy harvester 200 according to the invention. FIG. 8 is a cross-sectional view taken along line VIII-VIII' of FIG. 7.

Referring to FIGS. 7 and 8, an embodiment of the piezoelectric energy harvester 200 includes a base 210, a clamping structure that is supported by the base 210, a cantilever structure having one side that is fixed by the clamping structure, and a piezoelectric material 227 that is disposed on the cantilever structure. The cantilever structure includes a cantilever beam 222 having one side that is fixed by the clamping structure and the other side that is elastically bendable, and a mass body 225 that is disposed on the cantilever beam 222.

The cantilever beam 222 may include, for example, but is not limited to, SUS, Cu, FR4, brass, Fe, W or a combination thereof. The mass body 225 may be disposed on, for example, an end portion of the cantilever beam 222. The piezoelectric material 227 may be disposed on the cantilever beam 222. In one exemplary embodiment, for example, the piezoelectric material 227 may include, but are not limited to, PZT, ZnO, SnO, PVDF, and P(VDF-TrFE). In an embodiment, the piezoelectric material 227 is disposed on a top surface of the cantilever beam 222 as shown in FIGS. 7 and 8, but not being limited thereto. In an alternative embodiment, the piezoelectric material 227 may be disposed on a bottom surface of the cantilever beam 222 or both the top surface and the bottom surface of the cantilever beam 222. When the mass body 225 is substantially vertically moved with respect to an extending direction of the cantilever beam 222 due to external vibration, the other side of the cantilever beam 222 is elastically bent, and thus the piezoelectric material 227 that is disposed on the cantilever beam 222 is deformed, thereby generating electrical energy. Although not shown in FIGS. 7 and 8, electrodes for outputting the electrical energy that is generated by the piezoelectric material 227 may be further disposed on the cantilever beam 222. A first resonant frequency of the cantilever structure may be adjusted by using a material and a size of the cantilever beam 222 and a weight of the mass body 225. Accordingly, when the material and the size of the cantilever beam 222 are predetermined, the first resonant frequency of the cantilever structure may be adjusted by changing the weight of the mass body 225.

A cavity 260 having a predetermined shape is formed in the base 210, and the top of the base 210 is open. The clamping structure includes a cavity cover 234 that is disposed on the top of the base 210 to cover the cavity 260, and a clamping bolt 231 that passes through the cavity cover 234 and fixes the one side of the cantilever beam 222. The cavity cover 234 is spaced apart from the bottom of the cavity 260 by a predetermined interval. A clamping plate 232 for more effectively fixing the cantilever beam 222 may be further disposed on the one side of the cantilever beam 222. As the clamping bolt 231 passes through the clamping plate 232, the one side of the cantilever beam 222, and the cavity cover 234, the one side of the cantilever beam 222 may be predetermined. Beam fixing members 235 for preventing the cantilever beam 222 from being rotated may be further disposed on at least one side of the clamping bolt 231. The beam fixing members 235 may pass through, for example, but are not limited to, the clamping plate 232 and the one side of the cantilever beam 222.

In an embodiment, the clamping bolt 231 and the cavity cover 234 may be coupled to each other by screw coupling. In such an embodiment, a male screw is formed on an outer surface of the clamping bolt 231, and a female screw corresponding to the male screw is formed in the cavity cover 234. A lower end portion of the clamping bolt 231 may be spaced apart from a first bottom surface 260*a* of the cavity 260 by a predetermined interval. The first bottom surface 260*a* is formed in a position corresponding to a position of the clamping bolt 231. In such an embodiment, a gap G2 that is a space provided to allow the clamping structure to be substantially vertically moved relative to the base 210 is defined, e.g., formed, between the lower end portion of the clamping bolt 231 and the first bottom surface 260*a* of the cavity 260. A size of the gap G2 may be adjusted using the clamping bolt 231.

The cavity cover 234 may be spaced apart by a predetermined interval D2 from a second bottom surface 260*b* of the cavity 260. The second bottom surface 260*b* is formed to correspond in position to the cavity cover 234. In an embodiment, the second bottom surface 260*b* is higher than the first bottom surface 260*a* with respect to a bottom surface of the base 210 as shown in FIG. 8. In an alternative embodiment, the second bottom surface 260*b* may be formed at the same height as that of the first bottom surface 260*a* or may be formed to be lower than the first bottom surface 260*a*. An elastic member 250 is disposed between the second bottom surface 260*b* of the cavity 260 and the cavity cover 234. The elastic member 250 allows the clamping structure to elastically move relative to the base 210. In one embodiment, for example, the elastic member 250 may be a compression coil spring that surrounds the clamping bolt 231. In such an embodiment, the elastic member 250 applies an elastic force to increase an interval between the second bottom surface 260*b* of the cavity 260 and the cavity cover 234. In an alternative embodiment, the elastic member 250 may include any of various elastic materials other than the compression coil spring.

In an embodiment, as described above, when the gap G2 is defined between the lower end portion of the clamping bolt 231 and the first bottom surface 260*a* of the cavity 260 and the elastic member 250 is disposed between the cavity cover 234 and the second bottom surface 260*b* of the cavity 260, the clamping structure is elastically moved relative to the base 210 substantially vertically due to external vibration. A second resonant frequency of the clamping structure may be determined based on a weight of the clamping structure, an elastic modulus of the elastic member 250, and the interval D2 between the cavity cover 234 and the second bottom surface 260*b* of the cavity 260. Accordingly, in an embodiment, where the weight of the clamping structure and the elastic modulus of the elastic member 250 are predetermined, the second resonant frequency of the clamping structure may be adjusted by changing the interval D2 between the cavity cover 234 and the second bottom surface 260*b* of the cavity 260.

In such an embodiment, the piezoelectric energy harvester 200 as described above may convert vibration energy into electrical energy and may harvest the electrical energy in a frequency range with a wide bandwidth by adjusting the first resonant frequency of the cantilever structure and/or the second resonant frequency of the clamping structure to allow the first and second resonant frequencies to be substantially the same as or similar to each other. The piezoelectric energy harvester 200 may further include a housing 215 that is a case that covers the cantilever structure and the clamping structure and that may be fixed to the base 210.

EXPERIMENT 1

Figure 9:
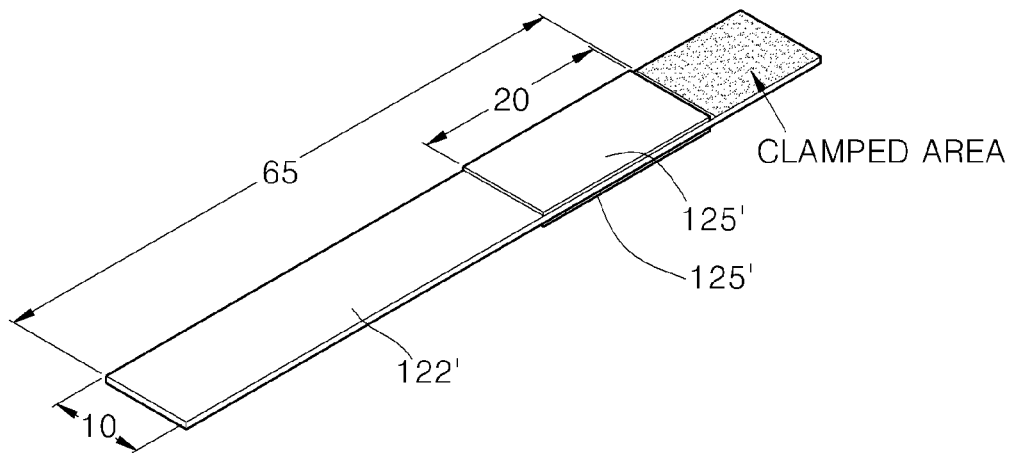
FIG. 9 is a perspective view illustrating a cantilever beam that is used in Experiment 1.

FIG. 9 is a perspective view illustrating an embodiment of a cantilever beam 122' that is used in Experiment 1. Referring to FIG. 9, the cantilever beam 122' has a linear band shape. One end portion of the cantilever beam 122' may be clamped by a clamping structure, and a mass body may be disposed on the other end portion of the cantilever beam 122'. Piezoelectric materials 125' are respectively disposed on a top surface and a bottom surface of the cantilever beam 122'. The cantilever beam 122' is formed of SUS, and each of the piezoelectric materials 125' is formed of PZT. Each size in FIG. 9 is measured in millimeter (mm), and thicknesses of the cantilever beam 122' and the piezoelectric material 125' are about 0.3 mm.

Figure 10:
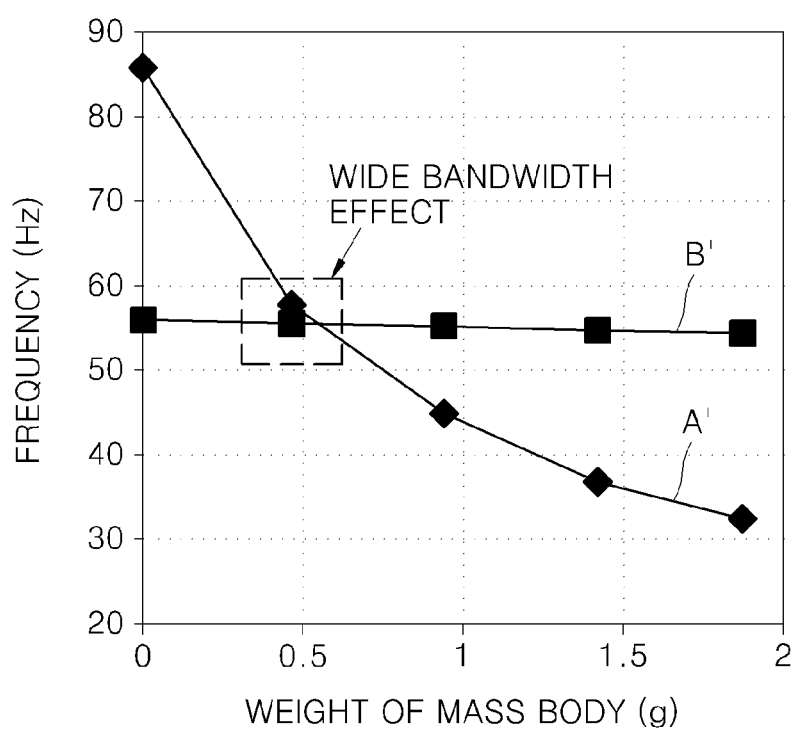
FIG. 10 is a graph illustrating first resonant frequency A' (hertz: Hz) of a cantilever structure and second resonant frequency B' (Hz) of a clamping structure versus weight (gram: g) of a mass body in an embodiment of an energy harvester according to the invention, which includes the cantilever beam of FIG. 9.

FIG. 10 is a graph illustrating a first resonant frequency A' (hertz: Hz) of a cantilever structure and a second resonant frequency B' (Hz) of a clamping structure versus weight (gram: g) of a mass body in an embodiment of a piezoelectric energy harvester according to the invention that includes the cantilever beam 122' of FIG. 9. The clamping structure used herein is substantially the same as the clamping structure of FIG. 4. Referring to FIG. 10, the first resonant frequency A' of the cantilever structure decreases as the weight of the mass body increases. The graph in FIG. 10 shows that the second resonant frequency B' is maintained substantially constant even as the weight of the mass body is changed. The piezoelectric energy harvester that may convert vibration energy into electrical energy and may harvest the electrical energy in a frequency range with a wide bandwidth as described below by changing the weight of the mass body to allow the first resonant frequency A' of the cantilever structure and the second resonant frequency B' of the clamping structure to be substantially the same as or similar to each other in FIG. 10.

Figure 11A:
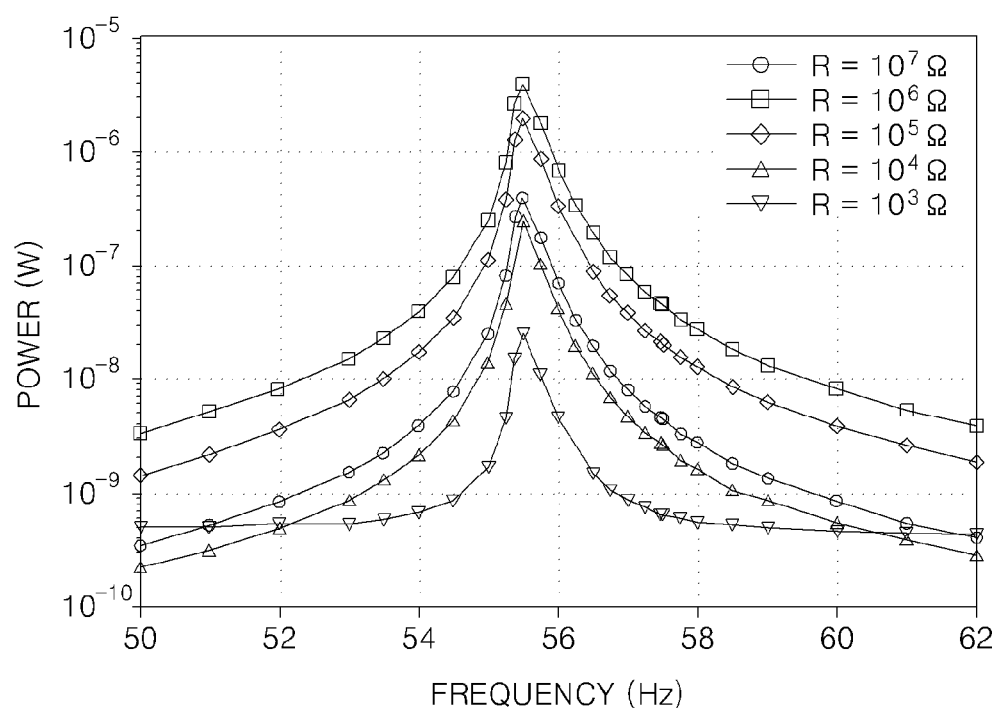
FIG. 11A is a graph illustrating amount of power (watt: W) versus frequency (Hz) of a conventional cantilever-type energy harvester including the cantilever beam of FIG. 9.
Figure 11B:
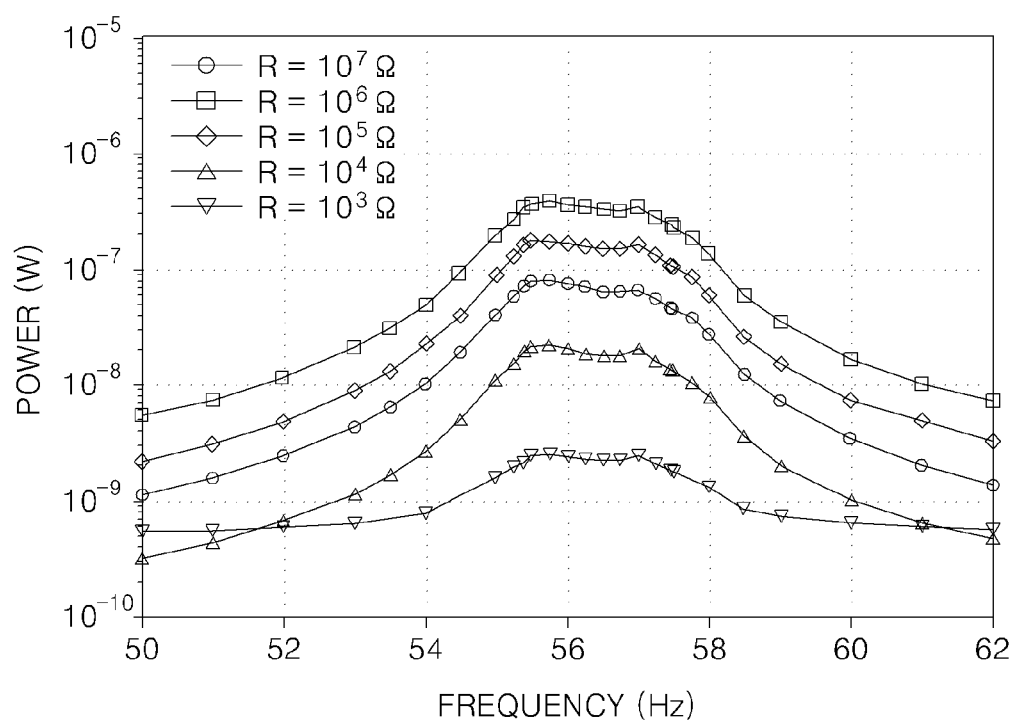
FIG. 11B is a graph illustrating the amount of power (W) versus frequency (Hz) of an embodiment of an energy harvester according to the invention, which includes the cantilever beam of FIG. 9.

FIG. 11A is a graph illustrating amount of power (watt: W) versus frequency (Hz) of a conventional cantilever-type piezoelectric energy harvester including the cantilever beam 122' of FIG. 9. FIG. 11B is a graph illustrating amount of power (W) versus frequency (Hz) of an embodiment of a piezoelectric energy harvester according to the invention which includes the cantilever beam 122' of FIG. 9. An embodiment of the piezoelectric energy harvester according to the invention is an energy harvester in which the first resonant frequency A' of the cantilever structure and the second resonant frequency B' of the clamping structure are substantially the same as each other by controlling the weight of the mass body as shown in FIG. 10. In the embodiment of the invention used in Experiment 1, the second resonant frequency B' of the clamping structure was about 56 Hz, and the first resonant frequency A' of the cantilever structure was adjusted to be about 57 Hz by the mass body having a weight of about 0.47 g. The conventional cantilever-type piezoelectric energy harvester is an energy harvester, in which only the cantilever structure from among the cantilever structure and the clamping structure of the piezoelectric energy harvester is substantially the same as the cantilever structure of the embodiment of the invention. R in FIGS. 11A and 11B denotes a resistance value (ohm: Ω) of a load that is used to measure output power.

Referring to FIG. 11A, when the weight of the mass body was 0.47 g, a frequency bandwidth of the conventional cantilever-type piezoelectric energy harvester was about 0.5 Hz. The term "frequency bandwidth" refers to a frequency range at a point corresponding to about 70% of maximum output power. Referring to FIG. 11B, a frequency bandwidth of the piezoelectric energy bandwidth of the embodiment of the invention was about 2.5 Hz. As such, in an embodiment, the maximum output of the piezoelectric energy harvester is slightly less than the maximum output of the conventional cantilever-type piezoelectric energy harvester, but a frequency bandwidth of the piezoelectric energy harvester of the embodiment of the invention is about 400% greater than a frequency bandwidth of the conventional cantilever-type piezoelectric energy harvester. In such an embodiment, a frequency bandwidth of the piezoelectric energy harvester is about 200% greater than a frequency bandwidth of the conventional cantilever-type piezoelectric energy harvester, at the same output power.

EXPERIMENT 2

Figure 12:
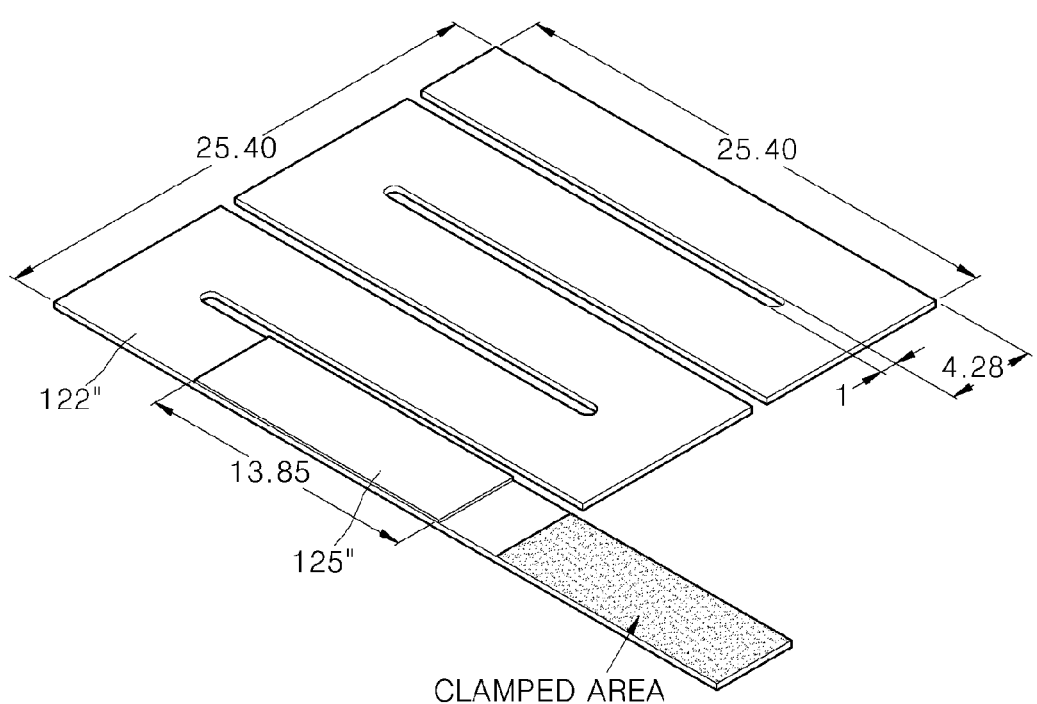
FIG. 12 is a perspective view of a cantilever beam that is used in Experiment 2.

FIG. 12 is a perspective view of a cantilever beam 122" used in Experiment 2. Referring to FIG. 12, the cantilever beam 122" has a zigzag shape. One end portion of the cantilever beam 122" may be clamped by a clamping structure, and a mass body may be disposed on the other portion of the cantilever beam 122". A piezoelectric material 125" is disposed on a top surface of the cantilever beam 122". The cantilever beam 122" is formed of SUS, and the piezoelectric material 125" is formed of PZT. Each dimension indicated in FIG. 12 is measured in mm, and thicknesses of the cantilever beam 122 and the piezoelectric material 125" are about 0.3 mm.

Figure 13:
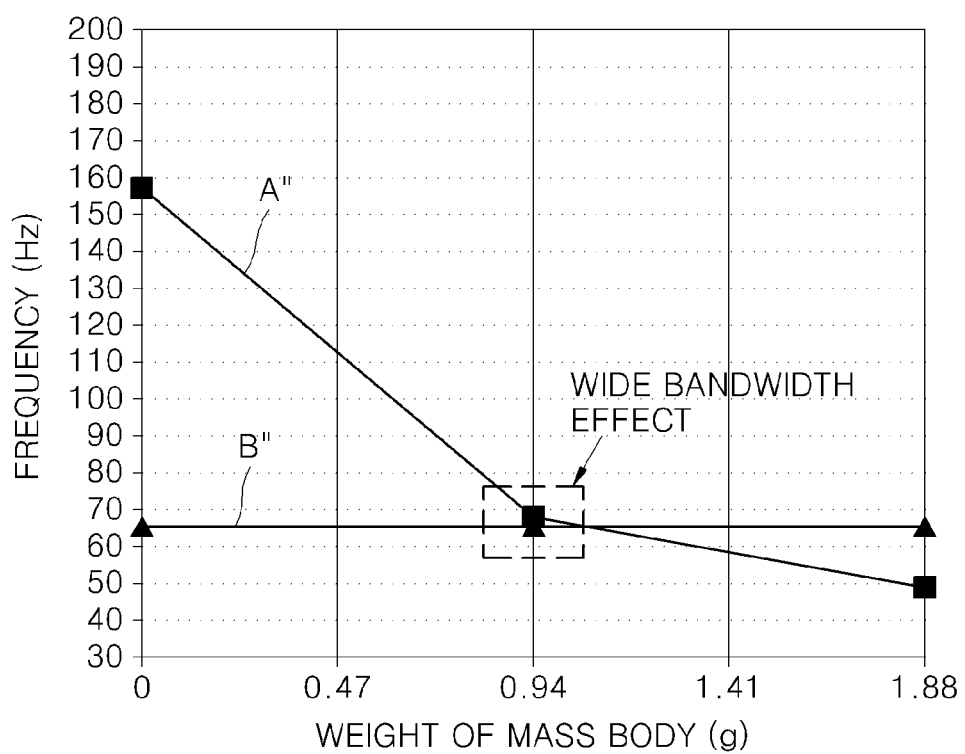
FIG. 13 is a graph illustrating first resonant frequency A" (Hz) of a cantilever structure and second resonant frequency B" (Hz) of a clamping structure versus weight (g) of a mass body in an embodiment of an energy harvester according to the invention, which includes the cantilever beam of FIG. 12.

FIG. 13 is a graph illustrating first resonant frequency A" (Hz) of a cantilever structure and second resonant frequency B" (Hz) of a clamping structure versus weight (g) of a mass body in an embodiment of a piezoelectric energy harvester according to the invention, which includes the cantilever beam 122" of FIG. 12. The clamping structure of such an embodiment is substantially the same as the clamping structure of FIG. 4. Referring to FIG. 13, the first resonant frequency A" of the cantilever structure decreases as the weight of the mass body increases, and the second resonant frequency B" of the clamping structure is maintained substantially constant even as the weight of the mass body is changed. The piezoelectric energy harvester that may convert vibration energy into electrical energy and may harvest the electrical energy in a frequency range with a wide bandwidth as described below by controlling the weight of the mass body to allow the first resonant frequency A" of the cantilever structure and the second resonant frequency B" of the clamping structure to be substantially the same as or similar to each other in FIG. 13.

Figure 14A:
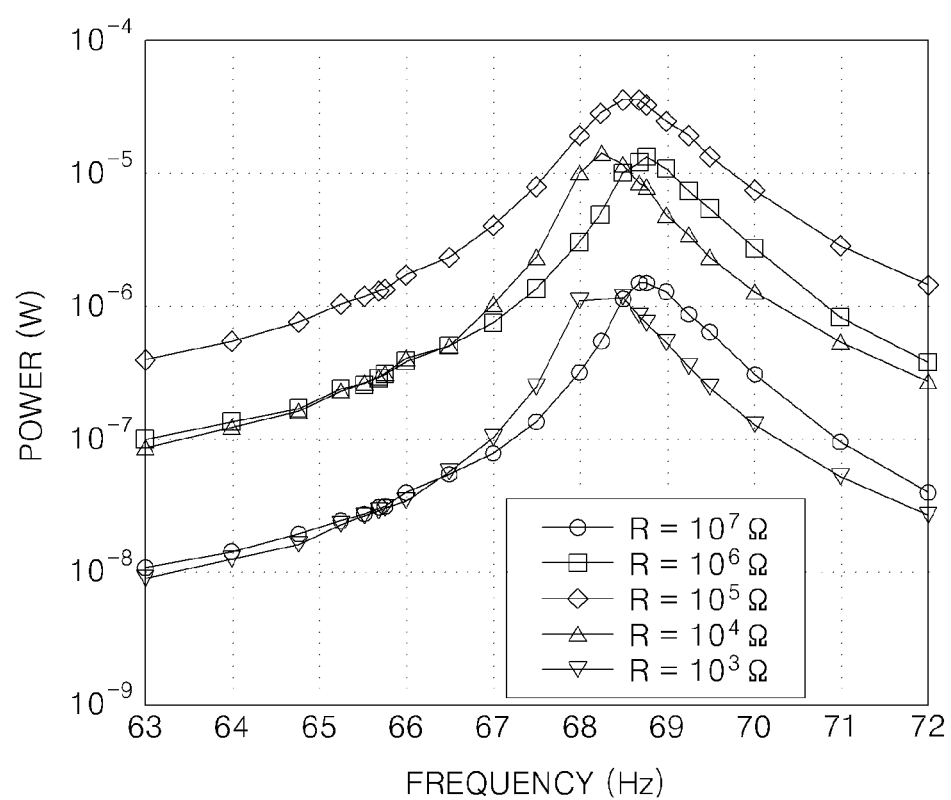
FIG. 14A is a graph illustrating amount of power (W) versus frequency (Hz) of a conventional cantilever-type energy harvester including the cantilever beam of FIG. 12.
Figure 14B:
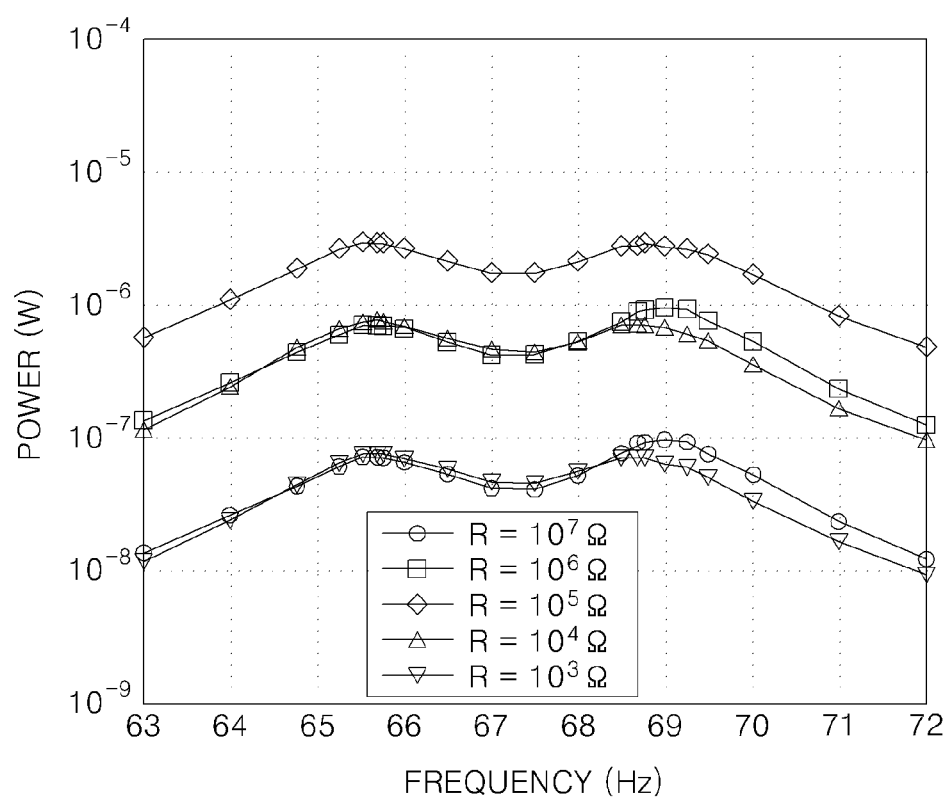
FIG. 14B is a graph illustrating amount of power (W) versus frequency (Hz) of an embodiment of an energy harvester according to the invention, which includes the cantilever beam of FIG. 12.

FIG. 14A is a graph illustrating amount of power (W) versus frequency (Hz) of a conventional cantilever-type piezoelectric energy harvester including the cantilever beam 122" of FIG. 12. FIG. 14B is a graph illustrating amount of power (W) versus frequency (Hz) of an embodiment of a piezoelectric energy harvester according to the invention that includes the cantilever beam 122" of FIG. 12. Such an embodiment of the piezoelectric energy harvester according to the invention is an energy harvester in which the first resonant frequency A" of the cantilever structure and the second resonant frequency B" of the clamping structure are substantially the same as each other by controlling the weight of the mass body, as shown in FIG. 13. In the embodiment of the invention used in Experiment 2, the second resonant frequency B" of the clamping structure was about 67 Hz, and the first resonant frequency A" of the cantilever structure was adjusted to be about 69 Hz by the mass body having a weight of about 0.94 g. The conventional cantilever-type piezoelectric energy harvester is an energy harvester, in which only the cantilever structure from among the cantilever structure and the clamping structure of the piezoelectric energy harvester is substantially the same as the cantilever structure of the embodiment of the invention. R in FIGS. 14A and 14B denotes a resistance value of a load that is used to measure output power.

Referring to FIG. 14A, when the weight of the mass body was about 0.94 g, a frequency bandwidth of the conventional cantilever-type piezoelectric energy harvester was about 0.7 Hz. Referring to FIG. 14B, a frequency bandwidth of the embodiment of the piezoelectric energy harvester according to the invention was about 5.2 Hz. As such, the maximum output of the embodiment of the piezoelectric energy harvester according to the invention is slightly less than the maximum output of the conventional cantilever-type piezoelectric energy harvester, but a frequency bandwidth of the embodiment of the piezoelectric energy harvester according to the invention is about 600% greater than a frequency bandwidth of the conventional cantilever-type piezoelectric energy harvester. Also, a frequency bandwidth of the embodiment of the piezoelectric energy harvester according to the invention is about 120% greater than a frequency bandwidth of the conventional cantilever-type piezoelectric energy harvester at the same output power. As such, the embodiment of the piezoelectric energy harvester according to the invention may harvest vibration energy in a frequency range with a wide bandwidth by changing a shape of the cantilever beam.

As described above, an embodiment of the piezoelectric energy harvester according to the invention may convert vibration energy into electrical energy in a frequency range with a wide bandwidth, and thus may more effectively harvest vibration energy that is generated in the environment.

Figure 15:
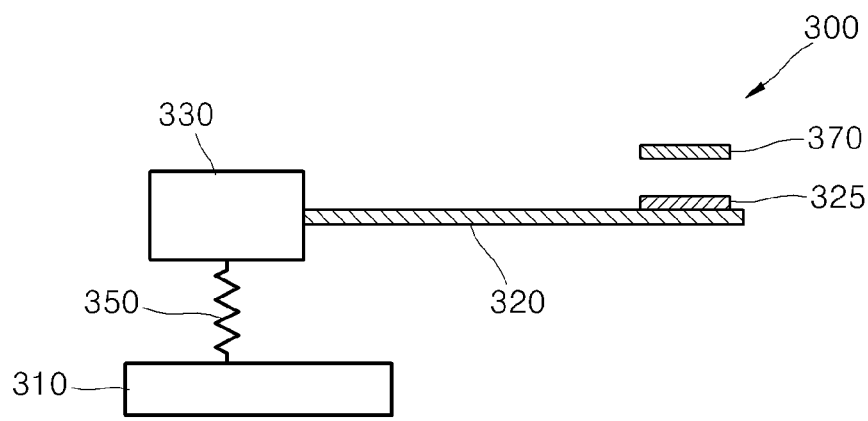
FIG. 15 is a schematic view illustrating an embodiment of an electrostatic energy harvester according to the invention.

FIG. 15 is a schematic view illustrating an embodiment of an electrostatic energy harvester 300 according to the invention.

Referring to FIG. 15, an embodiment of the electrostatic energy harvester 300 includes a base 310, a clamping structure 330 that is supported by the base 310, and a cantilever structure having one side that is fixed by the clamping structure 330. The cantilever structure includes a cantilever beam 320 having one side that is fixed by the clamping structure 330 and the other side that is elastically bendable, and a mass body 325 that is disposed on the cantilever beam 320. The cantilever beam 320 may include, for example, but is not limited to, SUS, Cu, FR4, brass, Fe, W or a combination thereof.

The mass body 325 may include an electret that is a material having quasi-permanent polarization. The mass body 325 that includes the electret may be disposed on an end portion of the cantilever beam 320. The electrostatic energy harvester 300 may further include a conductor 370 that is spaced apart from the mass body 325. When the mass body 325 that includes the electret is vertically moved with respect to an extending direction of the cantilever beam 320 due to external vibration, an interval between the mass body 325 and the conductor 370 is changed, and thus electrical energy is generated by the electrostatic effect. A first resonant frequency of the cantilever structure may be determined based on a material and a size of the cantilever beam 322 and a weight of the mass body 325.

The clamping structure 330 that fixes the one side of the cantilever beam 320 is disposed spaced apart from the base 310 by a predetermined interval. An elastic member 350 is disposed between the base 310 and the clamping structure 330. A second resonant frequency of the clamping structure 330 may be determined based on a weight of the clamping structure 330, an elastic modulus of the elastic member 350, and an interval between the base 310 and the clamping structure 330. The clamping structure 330 may be substantially the same as the clamping structure of FIGS. 4 through 6 or the clamping structure of FIGS. 7 and 8, and any repetitive detailed description of the clamping structure 330 will be omitted.

An embodiment of the electrostatic energy harvester 300 as described above may convert vibration energy into electrical energy and may harvest the electrical energy in a frequency range with a wide bandwidth by adjusting the first resonant frequency of the cantilever structure and/or the second resonant frequency of the clamping structure 330 to allow the first and second resonant frequencies to be substantially the same as or similar to each other. In an embodiment, the mass body 325 includes the electret and the conductor 370 is spaced apart from the mass body 325, as shown in FIG. 15, but in an alternative embodiment the mass body 325 may include a conductive material and an electret is spaced apart from the mass body 325.

Figure 16:
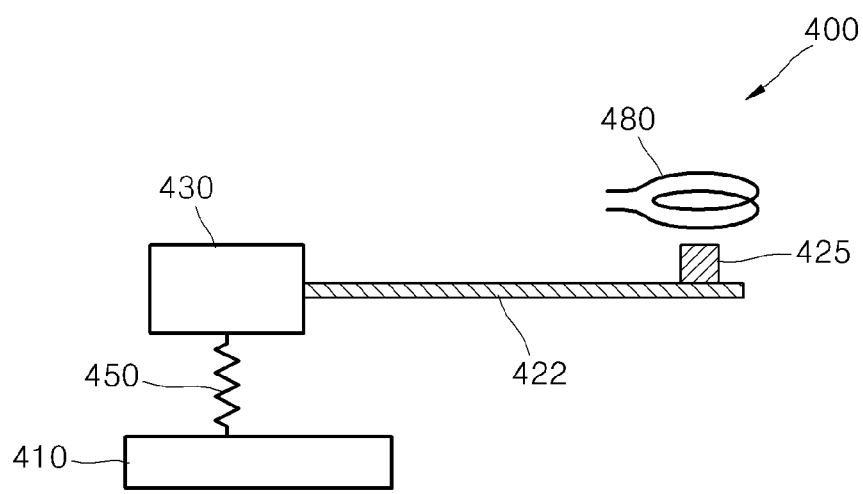
FIG. 16 is a schematic view illustrating an embodiment of an electrodynamic energy harvester according to the invention.

FIG. 16 is a schematic view illustrating an embodiment of an electrodynamic energy harvester 400 according to the invention.

Referring to FIG. 16, an embodiment of the electrodynamic energy harvester 400 includes a base 410, a clamping structure 430 that is supported by the base 410, and a cantilever structure having one side that is fixed by the clamping structure 430. The cantilever structure includes a cantilever beam 422 having one side that is fixed by the clamping structure 430 and the other side that is elastically bendable, and a mass body 425 that is disposed on the cantilever beam 422. The cantilever beam 422 may include, for example, but is not limited to, SUS, Cu, FR4, brass, Fe, W or a combination thereof.

The mass body 425 may include a magnet. The mass body 425 may be disposed on an end portion of the cantilever beam 422. The electrodynamic energy harvester 400 may further include a coil 480 that is spaced apart from the mass body 425. When the mass body 425 that includes the magnet is vertically moved with respect to an extending direction of the cantilever beam 422 due to external vibration, the intensity of a magnetic field that is formed in the coil 480 is changed, and thus electrical energy is formed in the coil 480 by the electrodynamic effect. A first resonant frequency of the cantilever structure may be determined based on a material and a size of the cantilever beam 422 and a weight of the mass body 425.

The clamping structure 430 that fixes the one side of the cantilever beam 422 is spaced apart from the base 410 by a predetermined interval. An elastic member 450 is disposed between the base 410 and the clamping structure 430. A second resonant frequency of the clamping structure 430 may be determined based on a weight of the clamping structure 430, an elastic modulus of the elastic member 450, and an interval between the base 410 and the clamping structure 430. The clamping structure 430 may be, for example, substantially the same as the clamping structure of FIGS. 4 through 6 or the clamping structure of FIGS. 7 and 8, and any repetitive detailed description of the clamping structure 430 will be omitted.

The electrodynamic energy harvester 400 constructed as described above may convert vibration energy into electrical energy and may harvest the electrical energy in a frequency range with a wide bandwidth by adjusting the first resonant frequency of the cantilever structure and/or the second resonant frequency of the clamping structure 430 to allow the first and second resonant frequencies to be substantially the same as or similar to each other.

One or more embodiments of the energy harvester according to of the invention may harvest energy in a frequency range with a wide bandwidth by using a vibration system with two degrees of freedom. In such embodiments, the energy harvester may convert vibration energy into electrical energy and may harvest the electrical energy in a frequency range with a wide bandwidth by using vibration of a first degree of freedom due to the cantilever structure and vibration of a second degree of freedom due to the clamping structure and by adjusting a resonant frequency of the cantilever structure and a resonant frequency of the clamping structure to be similar to each other. The energy harvester may be used as a power source of, for example, a mobile IT device or a WSN system and may be used as a vibration sensor having a predetermined frequency range. While one or more embodiments of the invention have been described with reference to the figures, it will be understood by those of ordinary skill in the art that various changes in form and details may be made therein without departing from the spirit and scope of the invention as defined by the following claims

What is claimed is:

1. An energy harvester for converting vibration energy into electrical energy and harvesting the electrical energy, the energy harvester comprising:
   a base;
   a clamping structure which is supported by the base and is spaced apart from the base;
   an elastic member which is disposed between the base and the clamping structure and allows the clamping structure to be elastically moved substantially vertically relative to the base; and
   a cantilever structure comprising:
      a cantilever beam having one side which is fixed to the clamping structure and the other side which is elastically bendable; and
      a mass body which is disposed on the other side of the cantilever beam.

2. The energy harvester of claim 1, wherein
   the cantilever structure has a first resonant frequency, and
   the clamping structure has a second resonant frequency.

3. The energy harvester of claim 2, wherein the first resonant frequency is substantially the same as or similar to the second resonant frequency.

4. The energy harvester of claim 1, wherein
   the clamping structure comprises:
      a clamping bolt which passes through the base, and fixes the one side of the cantilever beam, wherein a male screw is defined on an outer surface of the clamping bolt; and
      a clamping nut which is fitted onto an end portion of the clamping bolt and is spaced apart from the base, and
   the elastic member is disposed between the base and the clamping nut.

5. The energy harvester of claim 4, wherein a resonant frequency of the clamping structure is determined based on an interval between the base and the clamping nut.

6. The energy harvester of claim 4, wherein
   a female screw which corresponds to the male screw of the clamping bolt is defined in the base, and
   a gap, which allows the clamping structure to be moved relative to the base, is defined between the male screw of the clamping bolt and the female screw of the base.

7. The energy harvester of claim 4, wherein the clamping structure further comprises a clamping plate which is coupled to the clamping bolt and fixes the one side of the cantilever beam.

8. The energy harvester of claim 1, wherein
   a cavity is defined in the base,
   the clamping structure comprises:
      a cavity cover which covers the cavity; and
      a clamping bolt which passes through the cavity cover, and fixes the one side of the cantilever beam, wherein a male screw is defined on an outer surface of the clamping bolt, and
   the elastic member is disposed between a bottom surface of the cavity and the cavity cover.

9. The energy harvester of claim 8, wherein a resonant frequency of the clamping structure is determined based on an interval between the bottom surface of the cavity and the cavity cover.

10. The energy harvester of claim 8, wherein
    a gap, which allows the clamping structure to be moved relative to the base, is defined between one end of the clamping bolt and the bottom surface of the cavity.

11. The energy harvester of claim 8, wherein the clamping structure further comprises a clamping plate which is coupled to the clamping bolt and fixes the one side of the cantilever beam.

12. The energy harvester of claim 1, wherein the energy harvester is a piezoelectric energy harvester.

13. The energy harvester of claim 12, further comprising:
    a piezoelectric material disposed on the cantilever beam.

14. The energy harvester of claim 1, wherein the energy harvester is an electrostatic energy harvester.

15. The energy harvester of claim 14, further comprising:
    a conductor spaced apart from the mass body,
    wherein the mass body comprises an electret.

16. The energy harvester of claim 14, further comprising:
    an electret spaced apart from the mass body,
    wherein the mass body comprises a conductor.

17. The energy harvester of claim 1, wherein the energy harvester is an electrodynamic energy harvester.

18. The energy harvester of claim 17, further comprising:
    a coil spaced apart from the mass body,
    wherein the mass body comprises a magnet.

19. A method of manufacturing the energy harvester of claim 1, the method comprising:
    adjusting a first resonant frequency of the cantilever structure and/or a second resonant frequency of the clamping structure to allow the first and second resonant frequencies to be substantially the same as or similar to each other.

20. The method of claim 19, wherein
    the first resonant frequency may be adjusted by controlling a weight of the mass body, and
    the second resonant frequency may be adjusted by controlling an interval between the clamping structure and the base.

* * * * *